(12) United States Patent
Cohen

(10) Patent No.: US 7,565,119 B2
(45) Date of Patent: Jul. 21, 2009

(54) PREDISTORTION CORRECTION LOOP-BACK BASED ON HIGH LINEARITY AND LOW LINEARITY MODES

(75) Inventor: Emanuel Cohen, Zichron Yaacov (IL)

(73) Assignee: Intel Corporation, Santa Clara, CA (US)

( * ) Notice: Subject to any disclaimer, the term of this patent is extended or adjusted under 35 U.S.C. 154(b) by 449 days.

(21) Appl. No.: 11/646,713

(22) Filed: Dec. 28, 2006

(65) Prior Publication Data

US 2008/0159435 A1 Jul. 3, 2008

(51) Int. Cl.
*H04B 1/04* (2006.01)

(52) U.S. Cl. ............... 455/114.3; 455/114.2; 455/63.1; 375/297; 375/225

(58) Field of Classification Search .............. 455/114.2, 455/114.3, 63.11; 375/297, 225
See application file for complete search history.

(56) References Cited

U.S. PATENT DOCUMENTS

| 5,610,595 | A | * | 3/1997 | Garrabrant et al. ..... 340/825.52 |
|---|---|---|---|---|
| 6,751,447 | B1 | | 6/2004 | Jin et al. |
| 2002/0130727 | A1 | | 9/2002 | Nagasaka |
| 2003/0076894 | A1 | | 4/2003 | Jin et al. |
| 2004/0264596 | A1 | | 12/2004 | Vella-Coleiro |
| 2005/0002357 | A1 | * | 1/2005 | Hu et al. .................. 370/332 |
| 2007/0036208 | A1 | * | 2/2007 | Olgaard .................... 375/225 |

OTHER PUBLICATIONS

International Search Report/Written Opinion for PCT Patent Application No. PCT/US2007/086885, Mailed May 20, 2008, 10 pages.

* cited by examiner

*Primary Examiner*—Sanh D Phu
(74) *Attorney, Agent, or Firm*—The Law Offices of John C. Scott, LLC; John C. Scott

(57) ABSTRACT

A power amplifier pre-distortion calibration technique transmits two packets at different power levels for use in the calibration. As each packet is transmitted, it is received by the same device through a loop back path. The two received packets are then processed to develop the information needed to perform digital pre-distortion.

19 Claims, 5 Drawing Sheets

PREDISTORTION CORRECTION LOOP-BACK BASED ON HIGH LINEARITY AND LOW LINEARITY MODES

TECHNICAL FIELD

The invention relates generally to power amplifiers and, more particularly, to techniques for improving the efficiency of power amplifier operation.

BACKGROUND OF THE INVENTION

Many wireless standards specify a total power dissipation (TPD) figure that is not to be exceeded by a power amplifier within a wireless transmitter. Such requirements can limit the throughput that is achievable in a corresponding wireless link. Linear amplification is typically desired for power amplifiers within wireless transmitters. However, linear power amplifiers (e.g., class A amplifiers) are known to be inefficient and thus dissipate a large amount of power during operation. One technique to reduce the amount of power dissipated in a wireless transmitter is to use a more efficient non-linear amplifier and then use a linearization technique to improve the linearity of operation. One such linearization technique is known as pre-distortion. Pre-distortion uses information about the non-linearity of a power amplifier to pre-distort signals before they are amplified. The input signals are pre-distorted in a manner that counters the effect of the non-linearity when the signal is subsequently amplified. The use of pre-distortion techniques requires calibrations to be performed to characterize the non-linear operation of the power amplifier. Techniques are needed for performing accurate and reliable pre-distortion calibrations for power amplifiers in wireless transmitters.

DETAILED DESCRIPTION

Figure 1:
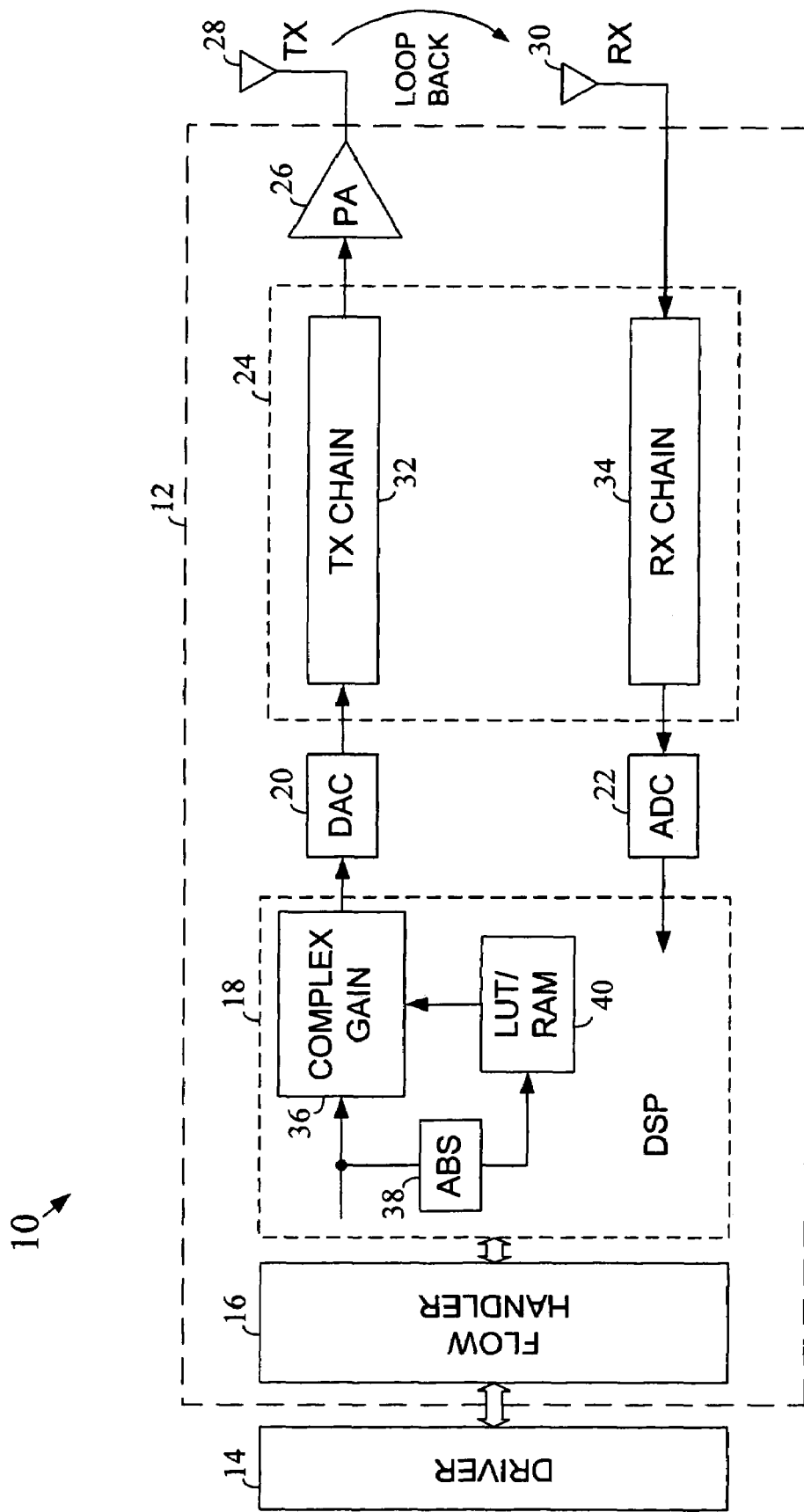
FIG. 1 is a block diagram illustrating a wireless transceiver arrangement in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to techniques for performing pre-distortion calibration for a power amplifier. The techniques may be used with any power amplifier, but are especially suited for use with power amplifiers within wireless transmitters. The calibration technique is relatively simple to employ and provides accurate and reliable results. In at least one embodiment of the invention, the techniques are used to provide power amplifier pre-distortion calibrations in the field during actual wireless transmitter operation, although operation in other contexts can also be performed. The techniques may be implemented within wireless transmitters with little or no added cost and are capable of providing a significant reduction in power dissipation within a transmitter. This power reduction may aid in meeting TPD requirements and can also enhance the maximum throughput that may be achieved by the transmitter. Some emerging wireless standards are requiring low error vector magnitude (EVM) figures for wireless devices. The inventive techniques may also be employed to enable a device to achieve these strict EVN requirements.

In at least one embodiment of the invention, a loopback calibration technique is used in which packets are transmitted from a wireless transmitter of a device and are then simultaneously received within a wireless receiver of the device during the calibration procedure. The same packet may be transmitted twice during the calibration; once at a low power level and once at a high power level. The low power and high power packets are each received in the wireless receiver of the device and are thereafter used to generate information characterizing the non-linearities of the power amplifier. This information is then used to develop information for use in performing pre-distortion within the transmit chain.

In the past, loopback pre-distortion calibration was typically performed using a single transmitted packet. The loopback signal associated with the single packet was then compared to a replica of the power amplifier input signal that was used to generate it. In addition to the power amplifier non-linearity, this loopback signal was also subject to various impairments (e.g., IQ imbalance, spur leakage, cross talk between the transmitter and the receiver, filter group delay, etc.) in the transceiver that modified the signal in a manner that made it difficult to accurately extract the PA non-linearity information. By using both a low power packet and a high power packet during calibration, these various impairments can be overcome because each transmitted packet will experience substantially the same impairments.

FIG. 1 is a block diagram illustrating a wireless transceiver arrangement 10 in accordance with an embodiment of the present invention. The wireless transceiver arrangement 10 may be part of a wireless communication device such as, for example, a laptop, palmtop, desktop, or tablet computer having wireless networking functionality, a personal digital assistant (PDA) having wireless networking functionality, a cellular telephone, a satellite communicator, a pager, and/or other devices. In the illustrated embodiment, the wireless transceiver arrangement 10 includes a wireless transceiver module 12 (e.g., a wireless network interface card (NIC) or similar network interface structure, etc.) that interacts with a host operating system through a software driver 14. In some other embodiments, a transceiver arrangement may be used that is integral with the host communication device. As shown, the wireless transceiver module 12 includes: a flow handler 16, a digital processor 18, a digital-to-analog converter (DAC) 20, an analog-to-digital (A/D) converter 22, a radio frequency (RF) transceiver 24, and a power amplifier 26. In addition, the wireless transceiver module 12 may be coupled to one or more transmit antennas 28 to facilitate the transmission of wireless signals into a wireless channel and one or more receive antennas 30 to facilitate the reception of wireless signals from a wireless channel. In multiple input/multiple output (MIMO) embodiments, there may be multiple transmit chains 32 coupled to multiple transmit antennas 28 and/or multiple receive chains 34 coupled to multiple receive antennas 30.

The flow handler 16 controls the data flow between the driver 14 and the digital processor 18. In at least one embodiment, the flow handler 16 includes a number of different FIFO structures to adapt the rates between the elements. The digital processor 18 is operative to, among other things, pre-distort signals to be transmitted from the transmitter arrangement 10. Any type of digital processor may be used including, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others, including combinations of the above. In the illustrated embodiment, a DSP is used. The DAC 20 receives the baseband digital signal output by the processor 18 and converts it to an analog representation. The analog signal is then processed within a transmitter chain 32 within the RF transceiver 24 to generate a transmit signal. The transmit chain 32 may include functionality such as encoders, modulators, filters, amplifiers, up-converters, and the like. The transmit signal is then delivered to the power amplifier 26 which amplifies the signal before it is transmitted into a wireless channel from the transmit antenna(s) 28.

During a receive operation, a signal is first received by the receive antenna(s) 30. The signal is then processed within a receive chain 34 of the RF transceiver 24, which converts the signal to a baseband representation. The receive chain 34 may include functionality such as filters, one or more downconverters, demodulators, decoders, and the like. The analog baseband signal is delivered to the A/D converter 22 which converts the signal to a digital representation for processing within the digital processor 18.

As described above, the digital processor 18 may be used to provide pre-distortion to signals to be transmitted by the transceiver arrangement 10. As such, the processor 18 may be adapted to provide a controllable complex gain to signals being delivered to the RF transceiver 24 for transmission from the antenna 28. As shown in FIG. 1, the processor 18 may include a complex gain function 36 to provide a controllable complex gain for a signal to be transmitted. The complex gain that is provided at a particular point in time may depend upon, for example, the magnitude of the input signal provided to the complex gain unit 36. The processor 18 includes an absolute function (ABS) 38 that finds the envelope of the I/Q signal (or an approximation thereof) on the corresponding input line of the complex gain unit 36. The output of the ABS 38 is directed to the look up table (LUT) 40 which outputs a corresponding complex gain control value to the complex gain unit 36 so that an appropriate level of complex gain is applied to the signal before it is delivered to the DAC 20.

As discussed previously, the LUT 40 stores a plurality of complex gain control values that may be delivered to the complex gain unit 36 during transmit operations. The complex gain control values may be indexed according to input signal magnitude. The LUT 40 may be implemented using any type of digital storage or memory including, for example, random access memories (RAMs), erasable programmable ROMs (EPROMs), electrically erasable programmable ROMs (EEPROMs), flash memory, and/or others. The values stored in the LUT 40 are generated during a calibration process that characterizes the non-linearities of the power amplifier 26 and determines pre-distortion values that may be used to linearize the operation of the power amplifier 26. In at least one embodiment of the present invention, this calibration procedure is done during operation of the transceiver arrangement 10 in the field. In this manner, the calibration may be kept up to date during the life of the system and through variations in, for example, temperature, voltage, component drift, changes in antenna characteristics, and other changes and variations. This may be used to allow a communication device to satisfy performance requirements, such as EVM and/or other requirements.

In at least one embodiment of the present invention, the pre-distortion calibration procedure causes two packets to be transmitted by the transceiver arrangement 10 at two different power levels. That is, one of the packets will be transmitted at a higher power level and the other will be transmitted at a lower power level. A loop-back path 42 to the wireless receiver is then used to detect energy from the transmitted packets for use in performing the calibration. The digital processor 18 may store the packet information as it is received and then use the stored information to generate the LUT calibration information. In another possible approach, the digital processor 18 may deliver the raw data to the driver 14 (via flow handler 16) and the driver 14 may then use the data to generate the LUT information. In at least one embodiment, the same packet is used as both the high and low power packets (i.e., packets having the same content). In some embodiments, the packet is a dedicated packet that is only used for calibration purposes.

Figure 2:
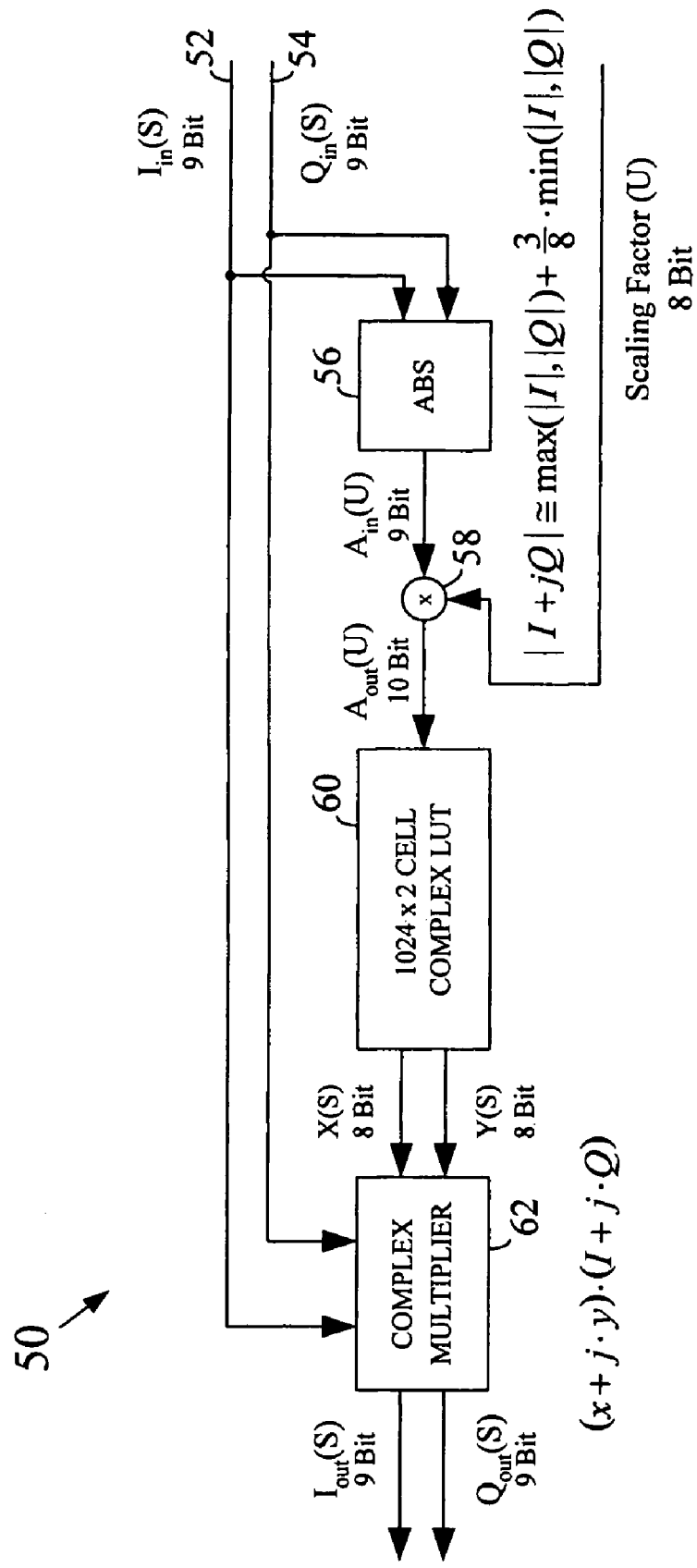
FIG. 2 is a block diagram illustrating example power amplifier pre-distortion functionality in accordance with an embodiment of the present invention.

FIG. 2 is a block diagram illustrating example power amplifier pre-distortion functionality 50 in accordance with an embodiment of the present invention. The power amplifier pre-distortion functionality 50 may be implemented within, for example, the digital processor 18 of FIG. 1 or another digital processing device (or combination of digital processing devices) within a different system. As shown, 9 bits of in-phase data ($I_{in}(S)$) and 9 bits of quadrature data ($Q_{in}(S)$) are received and I and Q inputs 52, 54. The $I_{in}(S)$ and $Q_{in}(S)$ data is then directed to the ABS 56 which uses the data to generate a 9 bit signal, $A_{in}(U)$. The $A_{in}(U)$ data is then directed to a multiplier 58 which multiplies the data by an 8 bit scaling factor to generate a 10 bit signal, $A_{out}(U)$. The scaling factor takes the envelope output by the ABS 56 and spreads it across the full dynamic range of the table to get improved resolution for correction. This allows the unit to use the same calibration for different output powers with little or no reduction in performance. The $A_{out}(U)$ data is directed to a 1024×2 cell complex LUT 60 that uses the signal to retrieve an 8 bit x(S) signal and an 8 bit y(S) signal, which define the complex gain to be used to process the input data. The x(S) and y(S) data are then directed to the complex multiplier 62 to be multiplied with $I_{in}(S)$ and $Q_{in}(S)$ (i.e., (x+jy)·(I+jQ)). The results (i.e., $I_{out}(S)$ and $Q_{out}(S)$) may then be delivered to a DAC for conversion to an analog representation before being directed to a TX chain and corresponding power amplifier.

Figure 3:
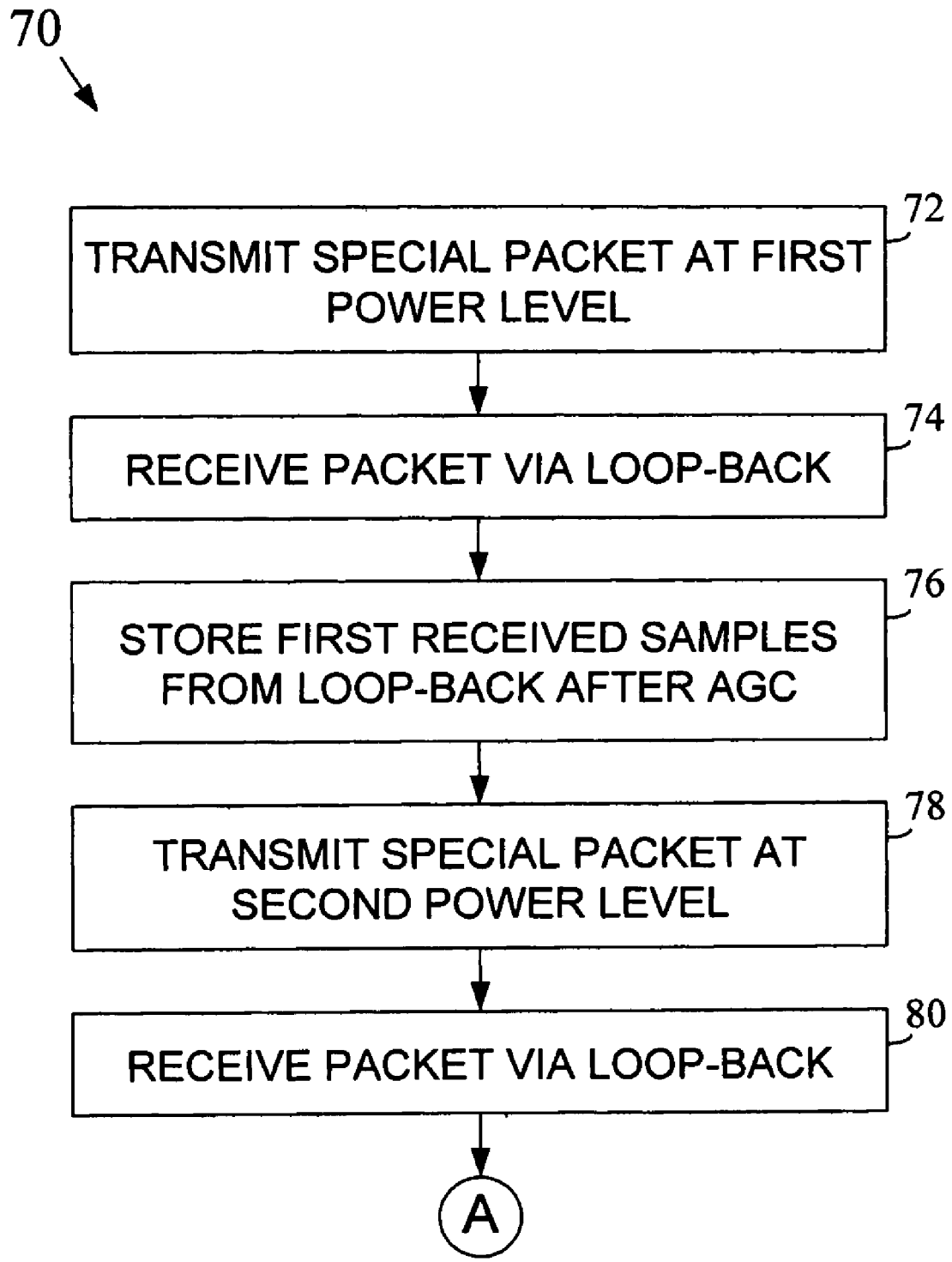
FIGS. 3 and 4 are portions of a flowchart illustrating an example method for performing a pre-distortion calibration for a power amplifier in accordance with an embodiment of the present invention.
Figure 4:
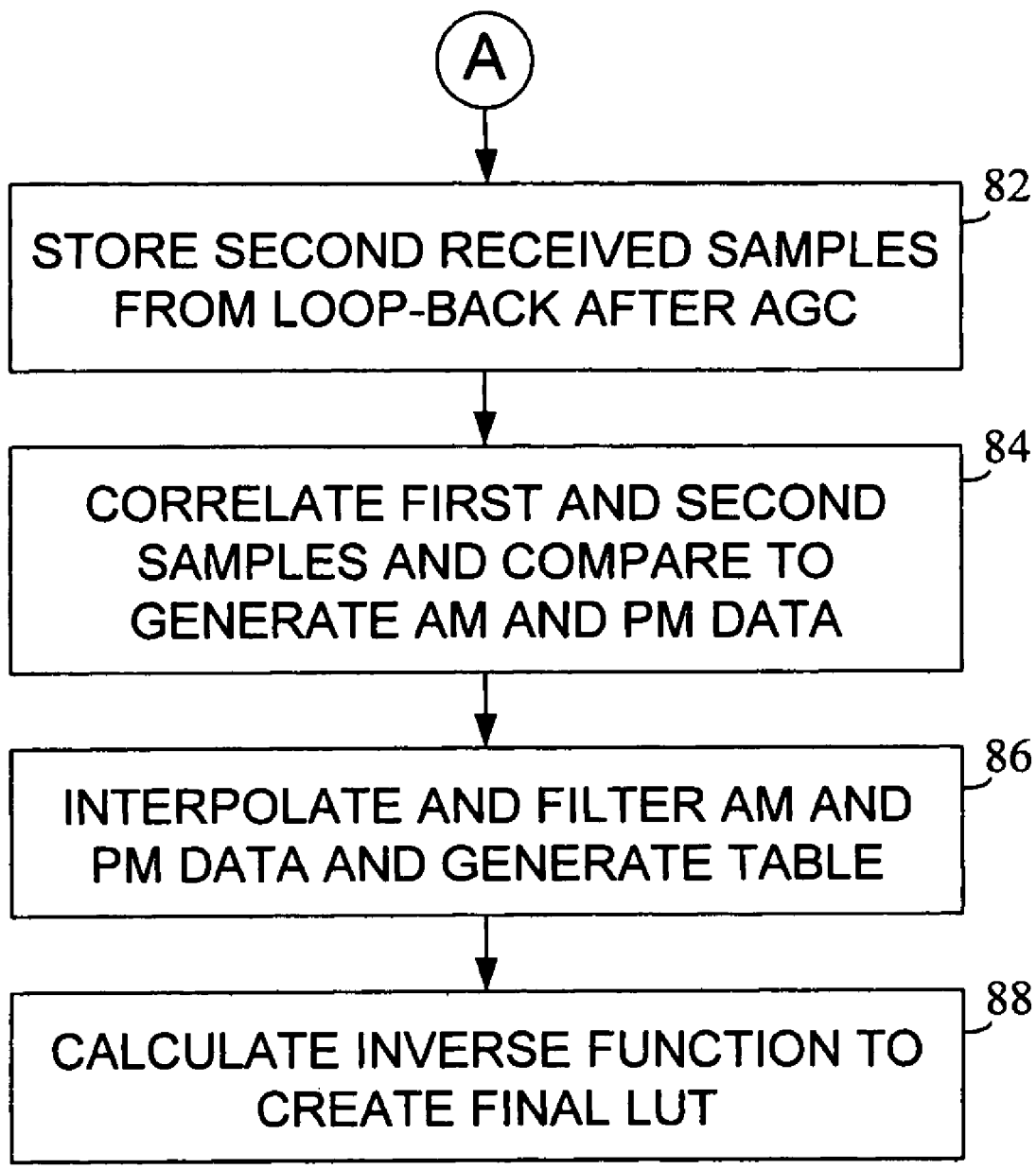

FIGS. 3 and 4 are portions of a flowchart illustrating an example method 70 for performing a pre-distortion calibration for a power amplifier in a wireless device in accordance with an embodiment of the present invention. First, a special packet is transmitted at a first power level from a wireless device (block 72). The special packet may be any packet and can be a packet that is dedicated for calibration purposes. In at least one embodiment, an orthogonal frequency division multiplexing (OFDM) packet carrying predefined data is used. The transmitted packet is received within a receiver of the device (or possibly multiple receivers in a MIMO based embodiment) via a loopback path (block 74). The samples of the received packet may then be stored within a storage location (block 76). This storage will typically occur after the samples have been processed by automatic gain control (AGC).

The same special packet is next transmitted at a second, different power level. For example, in at least one embodiment, the first power level may be the power level that would normally be used during device operation and the second power level may be significantly less. In other embodiments, the first power level may be smaller than the second power level. In one approach, for example, the first and second power levels differ by at least 4 or 5 deciBels (dB). The new transmitted packet is received within the receiver of the device via the loopback path (block 80) and the samples of the new received packet may then be stored (block 82). As before, this storage may occur after the samples have been processed by AGC.

The first stored samples and the second stored samples are then compared to generate amplitude modulation (AM) data and phase modulation (PM) data (block 84). The AM and PM data may then be interpolated and filtered to generate a table that is representative of the non-linearities of the power amplifier (block 86). An inverse function is then used to generate the final pre-distortion data for storage in the LUT (block 88). After the processing is finished, the pre-distortion data is stored within the LUT. In the wireless transceiver arrangement 10 of FIG. 1, the above-described processing may be performed within the digital processor 18, within the host processor (e.g., driver 14), or in a combination of the two. In other embodiments, a different arrangement may be used. The processing may be performed while the wireless device is in operation in the field.

Figures 5, 6:
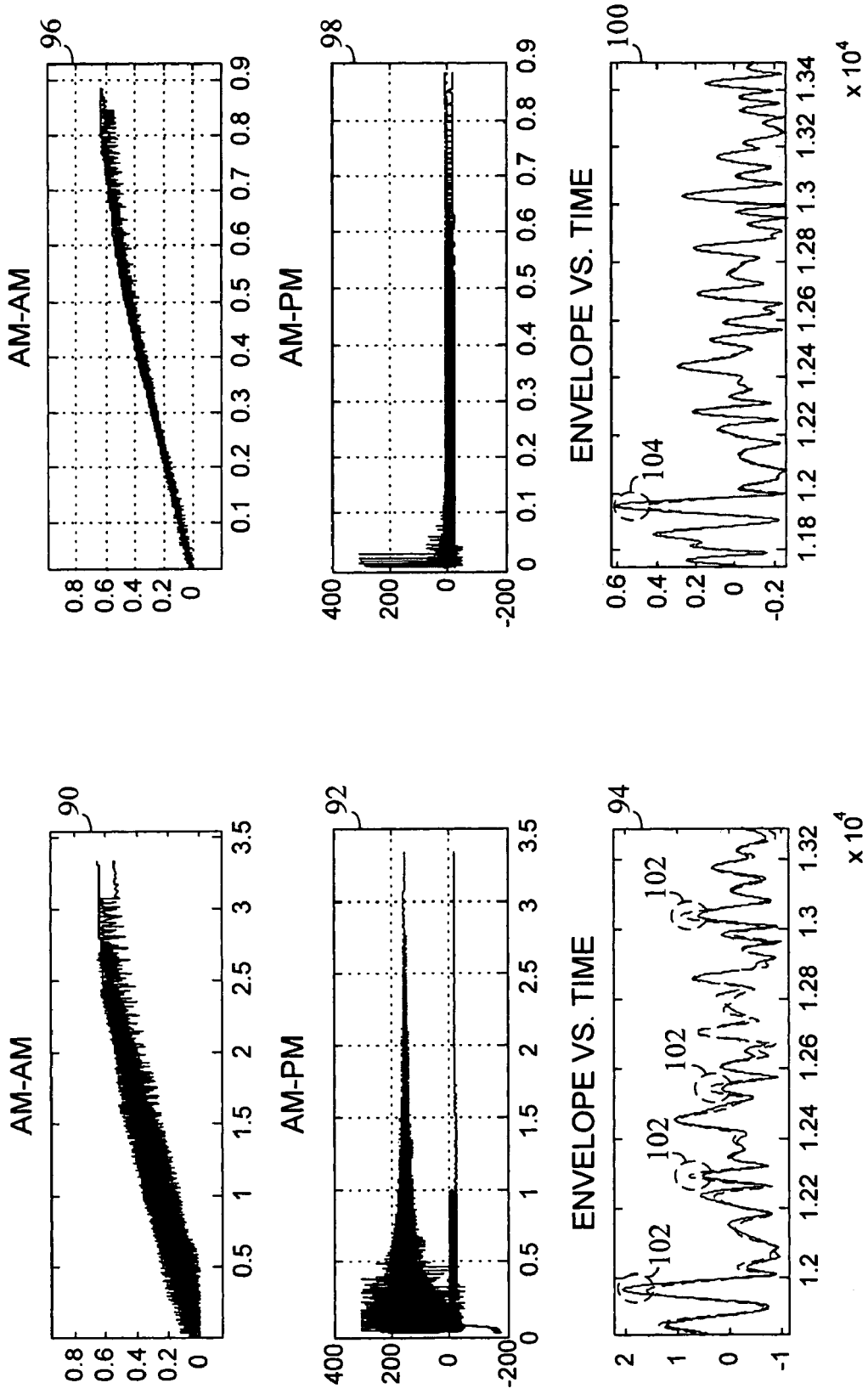
FIGS. 5 and 6 are graphs illustrating the performance enhancement that may be achieved using the inventive principles in accordance with an embodiment of the present invention.

FIGS. 5 and 6 are graphs illustrating the performance enhancement that may be achieved using the inventive principles in accordance with an embodiment of the present invention. FIG. 5 includes an AM-AM graph 90, and AM-PM graph 92, and an envelope versus time plot 94 for a prior art single packet pre-distortion calibration technique. FIG. 6 includes an AM-AM graph 96, and AM-PM graph 98, and an envelope versus time plot 100 for an implementation of the invention. In the envelope versus time plots 94, 100, a solid line is used to represent the reference signal and a dotted line is used to represent the signal output by the power amplifier. As shown in graphs 90 and 92, the prior art technique results in relatively high calibration error in both amplitude and phase, evidenced by the widely varying trace. The graphs 96, 98 corresponding to an implementation of the invention illustrate a much more robust calibration. The envelope versus time plots 94, 100 also illustrate the improved accuracy of the inventive technique. That is, the envelope versus time plot 94 corresponding to the prior art technique illustrates many points 102 where there is a large difference between the power amplifier output and the reference signal. The envelope versus time plot 100, on the other hand, includes far fewer points 104 where there is a significant difference between the power amplifier output and the reference signal. That is, the power amplifier output signal tracks the reference signal far more closely across the packet.

The techniques described above may be used to reduce power consumption in transmit mode within a wireless device. It is believed that power reductions of 50% and more can be achieved using these techniques. The techniques may also, or alternatively, be used to allow smaller, less costly power amplifiers to be used. In a MIMO-based implementation, the techniques may be used to activate a greater number of transmit chains without violating total power dissipation requirements. In this manner, significant throughput improvements can be achieved. The inventive techniques may be implemented in a wide range of different wireless communication systems (e.g., WiMAX, IEEE 802.11a, b, g, n, cellular, ultrawideband, and/or many others). The techniques also have application in non-communication based activities. The techniques do not need a special calibration mode to be implemented. In addition, the techniques require little or no additional hardware to be added to a transceiver. Therefore, the techniques may be added to a system with little extra cost (e.g., some extra gates may added to a baseband processor, etc.). By making the pre-distortion calibration more accurate, in a low cost manner, the inventive techniques can allow power amplifier and transceiver pre-distortion to be implemented within high volume manufacturing environments where it was heretofore impractical.

The techniques and structures of the present invention may be implemented in any of a variety of different forms. For example, features of the invention may be embodied within laptop, palmtop, desktop, and tablet computers having wireless capability; personal digital assistants (PDAs) having wireless capability; cellular telephones and other handheld wireless communicators; pagers; satellite communicators; cameras having wireless capability; audio/video devices having wireless capability; network interface cards (NICs) and other network interface structures; base stations; wireless access points; integrated circuits; as instructions and/or data structures stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data. In at least one form, the invention is embodied as a set of instructions that are modulated onto a carrier wave for transmission over a transmission medium. As used herein, the term "logic" may include, by way of example, software or hardware and/or combinations of software and hardware. Hardware, software, firmware, and hybrid implementations may be used.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A method comprising:
transmitting a first packet from a wireless device at a first power level, using a transmit power amplifier;
receiving said first packet in said wireless device via a loopback path and storing said received first packet;
transmitting a second packet from said wireless device at a second, different power level, using said transmit power amplifier, said second packet having the same content as said first packet;
receiving said second packet in said wireless device via said loopback path and storing said received second packet; and
processing said received first packet and said received second packet to generate information for use in performing digital pre-distortion for said transmit power amplifier.

2. The method of claim 1, wherein:
said first power level is a transmit power level that is used during normal communication operation in said wireless device.

3. The method of claim 1, wherein:
said first power level and said second power level differ by at least 4 dB.

4. The method of claim 1, wherein:
processing said received first packet and said received second packet includes correlating samples of said received first packet and samples of said received second packet and comparing said samples to generate amplitude modulation (AM) and phase modulation (PM) data.

5. The method of claim 4, wherein:
processing said received first packet and said received second packet includes interpolating and filtering said AM and PM data and using said interpolated and filtered data to form a table that is descriptive of the nonlinearities of said transmit power amplifier.

6. The method of claim 5, wherein:
processing said received first packet and said received second packet includes calculating an inverse of said data within said table to form said information for performing pre-distortion.

7. An apparatus comprising:
a wireless transceiver having at least one transmit chain and at least one receive chain;
a power amplifier to amplify transmit signals output by said at least one transmit chain before transmission into a wireless channel; and
a digital processor to generate pre-distortion information for use in implementing pre-distortion for said power amplifier, said digital processor to: cause a first packet to be transmitted at a first power level; cause a second packet to be transmitted at a second power level; and concurrently process a received first packet and a received second packet to generate information for performing digital pre-distortion for said power amplifier, said received first packet and said received second packet being received via a loopback path, wherein said first packet and said second packet include the same content.

8. The apparatus of claim 7, wherein:
said digital processor stores said information for performing pre-distortion in a lookup table.

9. The apparatus of claim 7, wherein:
said first power level is a transmit power level that is used during normal communication operation in said apparatus.

10. The apparatus of claim 7, wherein:
said first power level and said second power level differ by at least 4 dB.

11. The apparatus of claim 7, wherein:
said digital processor processes said received first packet and said received second packet by correlating samples of said packets and comparing said samples to one another to generate amplitude modulation (AM) and phase modulation (PM) data.

12. The apparatus of claim 11, wherein:
said digital processor further processes said received first packet and said received second packet by interpolating and filtering said AM and PM data and using said interpolated and filtered data to form a table that is descriptive of the nonlinearities of said transmit power amplifier.

13. The apparatus of claim 7, wherein:
said digital processor further processes said received first packet and said received second packet by calculating an inverse of said data within said table to form said information for performing pre-distortion.

14. An article comprising a computer readable storage medium having instructions stored thereon that, when executed by a computing platform, operate to:
cause a first packet to be transmitted from a wireless device at a first power level, using a transmit power amplifier;
cause a second packet to be transmitted from said wireless device at a second, different power level, using said transmit power amplifier, said second packet having the same content as said first packet; and
process a received first packet and a received second packet to generate information for use in performing digital pre-distortion for said transmit power amplifier, wherein said received first packet and said received second packet are received via a loop back path.

15. The article of claim 14, wherein:
said first power level is a transmit power level that is used during normal communication operation in said wireless device.

16. The article of claim 14, wherein:
said first power level and said second power level differ by at least 4 dB.

17. A system comprising:
at least one dipole antenna;
a wireless transceiver having at least one transmit chain and at least one receive chain, said wireless transceiver being coupled to said at least one dipole antenna;
a power amplifier to amplify transmit signals output by said at least one transmit chain before transmission into a wireless channel; and
a digital processor to generate pre-distortion information for use in implementing pre-distortion for said power amplifier, said digital processor to: cause a first packet to be transmitted by said wireless transceiver at a first power level; cause a second packet to be transmitted by said wireless transceiver at a second power level; and concurrently process a received first packet and a received second packet to generate information for performing digital pre-distortion for said power amplifier, said received first packet and said received second packet being received via a loopback path, wherein said first packet and said second packet include the same content.

18. The system of claim 17, wherein:
said first power level is a transmit power level that is used during normal communication operation in said system.

19. The system of claim 17, wherein:
said first power level and said second power level differ by at least 4 dB.

* * * * *